US011148081B2

(12) United States Patent
McKinley et al.

(10) Patent No.: US 11,148,081 B2
(45) Date of Patent: Oct. 19, 2021

(54) FILTER IDENTIFICATION

(71) Applicant: Caterpillar Inc., Peoria, IL (US)

(72) Inventors: Michael T. McKinley, Washington, IL (US); Ye Tian, Bloomington, IL (US); Stephan D. Roozenboom, Washington, IL (US)

(73) Assignee: Caterpillar Inc., Peoria, IL (US)

( * ) Notice: Subject to any disclaimer, the term of this patent is extended or adjusted under 35 U.S.C. 154(b) by 62 days.

(21) Appl. No.: 16/796,649

(22) Filed: Feb. 20, 2020

(65) Prior Publication Data

US 2021/0260510 A1 Aug. 26, 2021

(51) Int. Cl.
*B01D 35/143* (2006.01)
*G06K 7/08* (2006.01)
*H03K 17/97* (2006.01)

(52) U.S. Cl.
CPC ........... *B01D 35/143* (2013.01); *G06K 7/088* (2013.01); *B01D 2201/52* (2013.01); *H03K 17/97* (2013.01)

(58) Field of Classification Search
CPC .. B01D 35/143; B01D 2201/52; G06K 7/088; H03K 17/97
See application file for complete search history.

(56) References Cited

U.S. PATENT DOCUMENTS

| | | | |
|---|---|---|---|
| 7,196,515 B2 | 3/2007 | Roessler | |
| 9,349,943 B2 | 5/2016 | Röhrer | |
| 9,597,620 B2* | 3/2017 | Verdegan | G06Q 10/06 |
| 10,119,886 B2* | 11/2018 | Dhingra | B01D 46/429 |
| 2013/0220900 A1* | 8/2013 | Milvert | B01D 35/143 210/85 |
| 2017/0200028 A1 | 7/2017 | Deak et al. | |
| 2017/0340996 A1 | 11/2017 | Jo et al. | |
| 2020/0388138 A1* | 12/2020 | Miller | B01D 35/143 |

FOREIGN PATENT DOCUMENTS

| | | |
|---|---|---|
| CN | 201218156 Y | 4/2009 |
| CN | 207420765 U | 5/2018 |
| CN | 108885808 A | 11/2018 |
| CN | 110030129 A | 7/2019 |
| EP | 2774685 B1 | 7/2019 |
| KR | 1020200073774 | 12/2018 |
| WO | 2016004372 A1 | 1/2016 |

* cited by examiner

*Primary Examiner* — Terry K Cecil
(74) *Attorney, Agent, or Firm* — Harrity & Harrity LLP

(57) ABSTRACT

A filter identification system is disclosed. The filter identification system may include an identification component disposed in a filter mount configured to hold a set of filters that includes a first filter and a second filter. The identification component may include a sensor system that may include a first sensor configured to provide a first output signal corresponding to a state of the first sensor, and a second sensor configured to provide a second output signal corresponding to a state of the second sensor. The sensor system may be configured to provide a single output signal that is based on the first output signal and the second output signal and indicates a combined state of the first sensor and the second sensor.

20 Claims, 5 Drawing Sheets

11,148,081 B2

FILTER IDENTIFICATION

TECHNICAL FIELD

The present disclosure relates generally to filter identification and, for example, to filter identification using sensors, such as Hall-effect switches.

BACKGROUND

Machines include a number of components that work in coordination to perform various operations in the machine. Some of these components, such as filters, may need to be replaced at some stage of machine operation due to wear, reaching an end of a useful life, and/or the like. Accordingly, such filters may be a target for counterfeiters that may manufacture duplicate filters that are poorly designed or otherwise inferior. Accordingly, these duplicate filters may not meet the standards for original filters (e.g., as set by original equipment manufacturers (OEMs)), and may result in poor performance, damage to the machine and related accessories, low user satisfaction with the machine, and/or the like.

One attempt at an anti-counterfeit filter system is disclosed in China Patent Application Publication No. 110030129 that published on Jul. 19, 2019 ("the '129 publication"). In particular, the '129 publication discloses an anti-counterfeit filter system having a plurality of filters and a plurality of card readers, each of the filters being provided with an antenna, an electronic tag, and a sensor. In addition, the '129 publication states that the electronic tag stores filter information of the filter, the sensor monitors the filter cartridge state of the filter, and the card reader is electrically connected to a corresponding antenna and a corresponding sensor and is provided with a communication interface to communicate with the electronic control unit of the engine or the entire vehicle. The '129 publication indicates that when a filter element is replaced, since the electronic tag stores the filter element information, the filter information is transmitted to the antenna through wireless communication. Moreover, the '129 publication states that the information collected by the antenna is read and analyzed to determine whether the filter element is genuine or fake, and the analysis result is transmitted to the electronic control unit of the engine or the whole vehicle.

While the anti-counterfeit filter system of the '129 publication may enable determination of whether a filter is genuine or fake, the '129 publication does not describe the use of a single logical output signal for identifying a plurality of filters. Rather, the '129 publication indicates that filter information relating to a filter cartridge state of the filter is analyzed to determine whether a filter is genuine or fake. Such analysis may require significant time and processing resources, and may introduce complexities that may result in system failures, false positives, false negatives, and/or the like.

The filter identification system of the present disclosure solves one or more of the problems set forth above and/or other problems in the art.

SUMMARY

According to some implementations, a filter identification system may include an identification component disposed in a filter mount configured to hold a set of filters that includes a first filter and a second filter, the identification component including a sensor system that includes: a first sensor configured to provide a first output signal corresponding to a state of the first sensor; and a second sensor configured to provide a second output signal corresponding to a state of the second sensor, the sensor system configured to provide a single output signal that is based on the first output signal and the second output signal and indicates a combined state of the first sensor and the second sensor.

According to some implementations, a filter identification module may include: an identification component that includes a sensor system, the sensor system including a first sensor configured to provide a first output signal corresponding to a state of the first sensor; and a second sensor configured to provide a second output signal corresponding to a state of the second sensor, the sensor system configured to provide a single output signal that is based on the first output signal and the second output signal and indicates a combined state of the first sensor and the second sensor; and a controller configured to identify a first filter within a threshold proximity of the first sensor and a second filter within the threshold proximity of the second sensor based on the single output signal.

According to some implementations, a method may include causing an input voltage to be supplied to an identification component that includes a sensor system including a first sensor configured to provide a first output signal corresponding to a state of the first sensor and a second sensor configured to provide a second output signal corresponding to a state of the second sensor, the identification component disposed in a filter mount configured to hold a set of filters that includes a first filter and a second filter; and receiving, from the identification component, a single output voltage that is based on the first output signal and the second output signal and that indicates a combined state of the first sensor and the second sensor.

DETAILED DESCRIPTION

This disclosure relates to a filter identification system. The filter identification system has universal applicability to any machine utilizing one or more filters that may be replaced over a life of the machine. The term "machine" may refer to any machine that performs an operation associated with an industry such as, for example, mining, construction, farming, transportation, or any other industry. As some examples, the machine may be a vehicle, a backhoe loader, a cold planer, a wheel loader, a compactor, a feller buncher, a forest machine, a forwarder, a harvester, an excavator, an industrial loader, a knuckleboom loader, a material handler, a motor grader, a pipelayer, a road reclaimer, a skid steer loader, a skidder, a telehandler, a tractor, a dozer, a tractor scraper, or other above ground equipment, underground equipment, or marine equipment.

Figure 1:
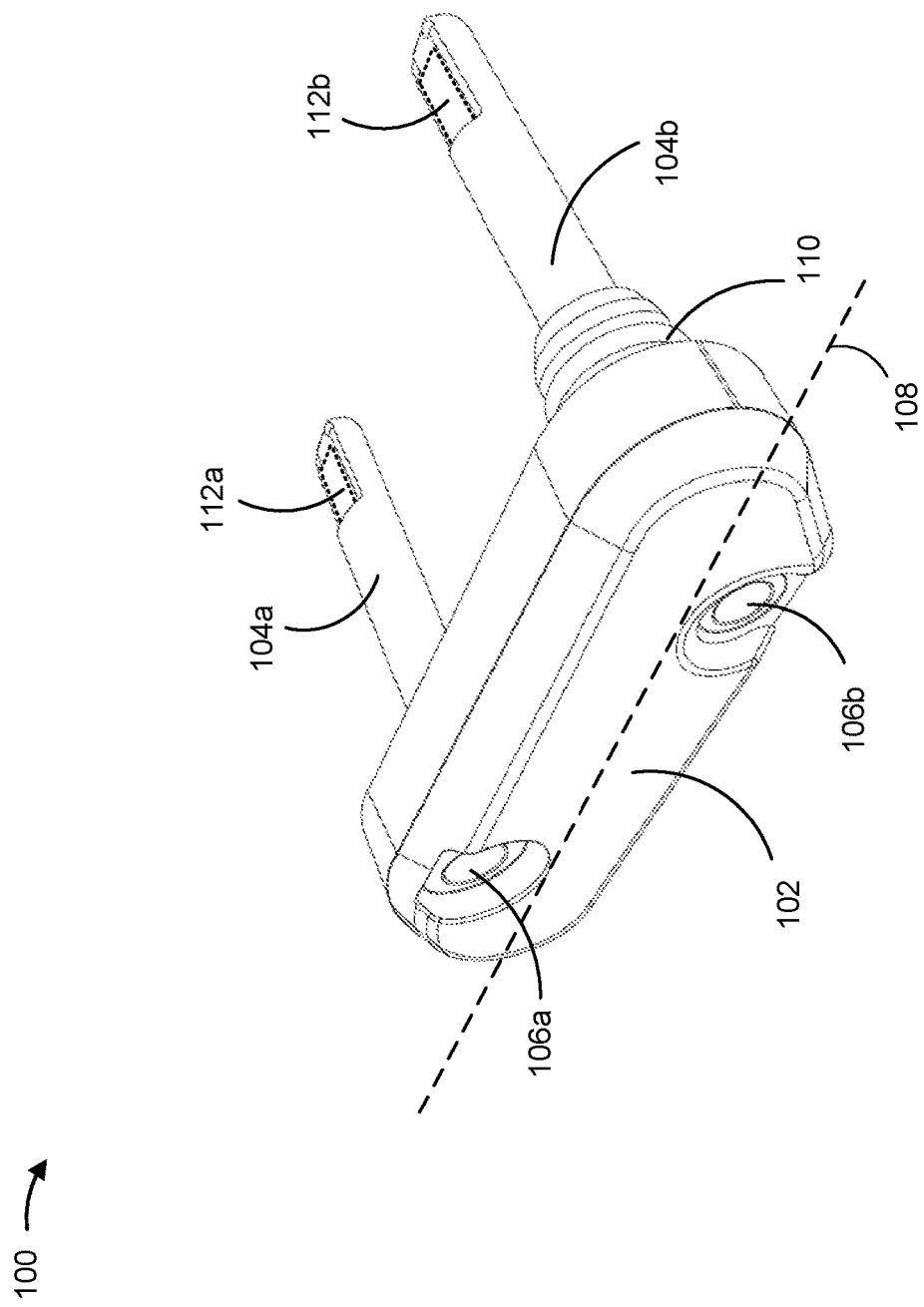
FIG. 1 is a diagram of an example identification component.

FIG. 1 is a diagram of an example identification component 100. The example identification component 100 includes a base 102, and a first prong 104a and a second prong 104b extending from the base 102. The first prong 104a and the second prong 104b may be orthogonal to the base 102 and parallel to each other. The first prong 104a and the second prong 104b may have the same length or different lengths.

Figure 2:
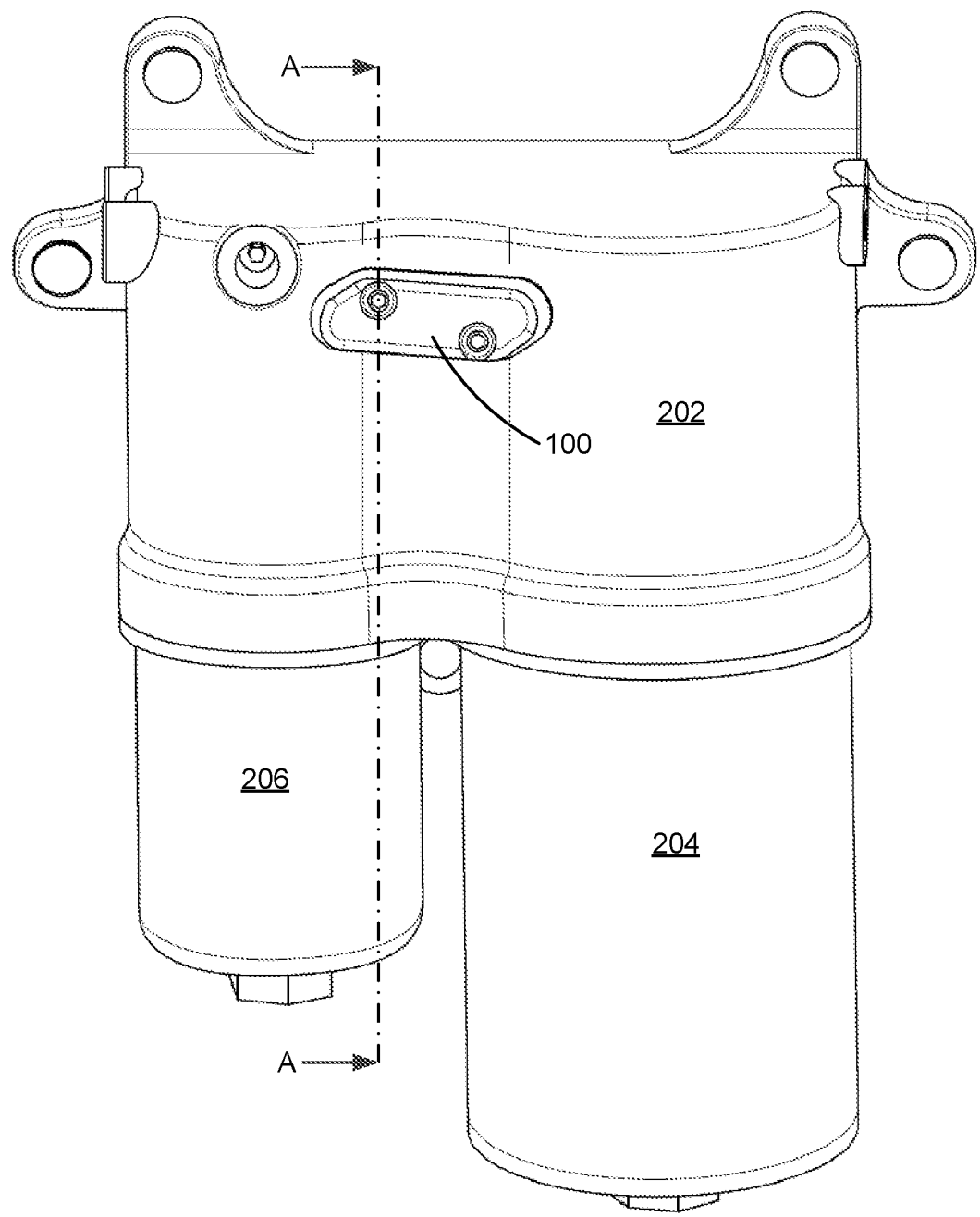
FIG. 2 is a diagram of an example filter system.

The base 102 may include first and second apertures 106a, 106b configured to receive respective fasteners, such as bolts, for attaching the identification component 100 to a filter mount 202 (shown in FIG. 2). The first aperture 106a may be located above a plane 108 that extends in the direction of the prongs 104, and the second aperture 106b may be located below the plane 108. Moreover, the first prong 104a may be located below the plane 108, and the second prong 104b may be located above the plane 108. In other words, the first prong 104a and the first aperture 106a, located at a first side of the base 102, may be located at opposite sides of the plane 108, and the second prong 104b and the second aperture 106b, located at a second side of the base 102, may be located at opposite sides of the plane 108.

The prongs 104 may include respective gaskets 110 (only one gasket 110 is shown in FIG. 1). The gaskets 110 provide a fluid-tight connection when the identification component 100 is attached to a filter mount 202, as described in connection with FIG. 2.

Figure 4:
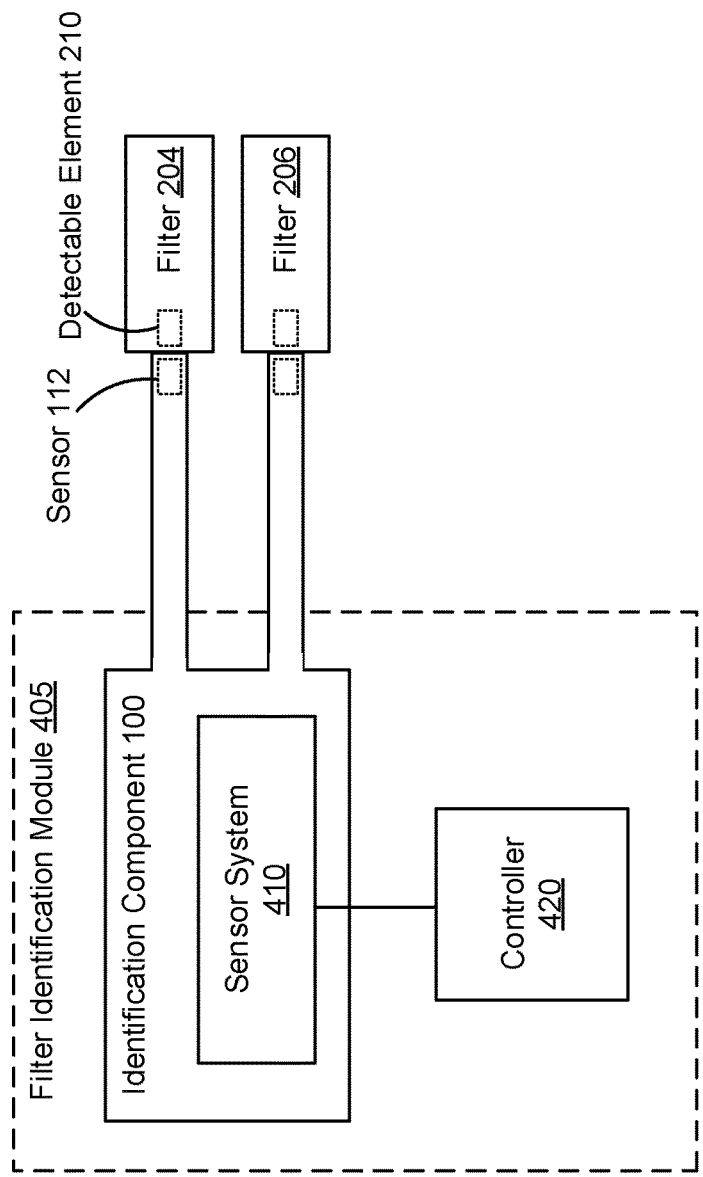
FIG. 4 is a diagram of an example filter identification system.

Distal ends (e.g., relative to the base 102) of the prongs 104 may include respective sensors 112a, 112b of a sensor system 410 (shown in FIG. 4). A distal end of a prong 104 may include a notch such that the distal end is separated from a proximal portion of the prong 104 by a step. Moreover, a distal end of a prong 104 may have a flat surface, and a proximal portion of the prong 104 may have a circular cross section.

The sensors 112 may be disposed in respective internal cavities of the prongs 104. In addition, the internal cavities may extend lengths of the prongs 104, such that the sensors 112 may be electrically connected in the base 102 by electrical wiring disposed in the internal cavities. Accordingly, the base 102 also may include an internal cavity in which electrical wiring, and associated circuitry elements, for the sensors 112 is disposed.

As indicated above, FIG. 1 is provided as an example. Other examples may differ from what is described in connection with FIG. 1.

FIG. 2 is a diagram of an example filter system 200. The filter system 200 may include the identification component 100 disposed in a filter mount 202 of the filter system 200. For example, the identification component 100 may be received in an aperture in the filter mount 202. The identification component 100 may be attached to the filter mount 202 by fasteners (e.g., bolts) that are received in the apertures 106a, 106b and corresponding apertures of the filter mount 202. The prongs 104 of the identification component 100 may extend internally into the filter mount 202.

The filter system 200 may include a set of filters including a first filter 204 and a second filter 206. In some implementations, the set of filters may include three or more filters. The filters 204, 206 may be fuel filters, oil filters, air filters, and/or the like. For example, the filters 204, 206 may be fuel filters, and the first filter 204 may be a primary fuel filter and the second filter 206 may be a secondary fuel filter. Accordingly, the filter system 200 may be a dual fuel filter system, such as for a modular (e.g., the fuel filters are replaceable) low-pressure fuel system.

The filters 204, 206 may be replaceable in the filter mount 202. For example, the filters 204, 206 may include respective threaded portions that mate with threads of the filter mount 202. In this way, a spent filter may be removed from the filter mount 202 by unscrewing the spent filter from the filter mount 202, and a new filter may be installed in the filter mount 202 by screwing the new filter into the filter mount 202.

As indicated above, FIG. 2 is provided as an example. Other examples may differ from what is described in connection with FIG. 2.

Figure 3:
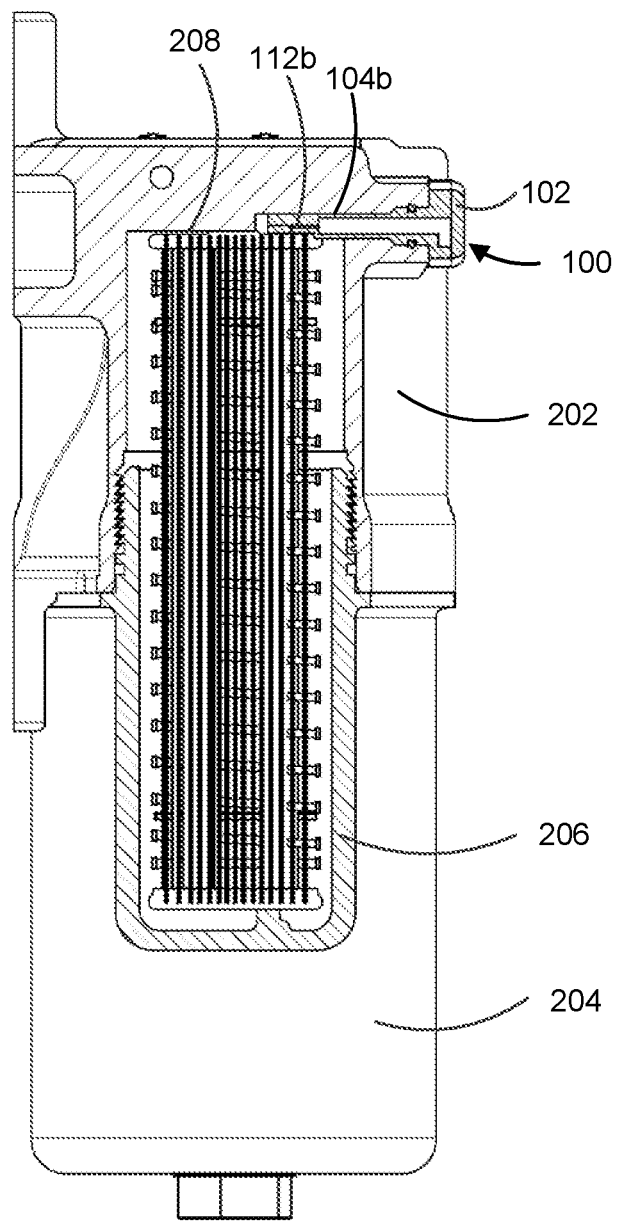
FIG. 3 is a cross-sectional view of the example filter system of FIG. 2 taken along line A-A.

FIG. 3 is a cross-sectional view of the example filter system 200 of FIG. 2 taken along line A-A. As shown in FIG. 3, the second prong 104b of the identification component 100 may extend into the filter mount 202 to abut the filter 206 (and the first prong 104a may extend into the filter mount 202 to abut the filter 204, not shown). That is, the flat surface of the distal end of the second prong 104b, which includes the sensor 112b, may abut a cap 208 of the filter 206 (and the flat surface of the distal end of the first prong 104a, which includes the sensor 112a, may abut a cap of the filter 204, not shown). The prongs 104 may be a particular length, such that the sensors 112 are located above particular respective areas of the caps of the filters 204, 206. Accordingly, the caps of the filters 204, 206 may include detectable elements 210 (shown in FIG. 4) located in the respective particular areas.

As indicated above, FIG. 3 is provided as an example. Other examples may differ from what is described in connection with FIG. 3.

FIG. 4 is a diagram of an example filter identification system 400. As shown in FIG. 4, the filter identification system 400 includes a filter identification module 405. The filter identification module 405 includes the identification component 100, which includes a sensor system 410. The filter identification module 405 further includes a controller 420 that is in communication with the identification component 100 (e.g., the sensor system 410 of the identification component 100).

As described above, the sensor system 410 may include the sensors 112. The sensors 112 may be radio-frequency identification (RFID) readers, Hall-effect switches, other magnetic field sensors, and/or the like, that are included in a circuit of the sensor system 410. The detectable elements 210 of the filters 204, 206 may be configured to affect respective states of the sensors 112. For example, the detectable elements 210 may be RFID tags (e.g., if the sensors 112 are RFID readers), magnets (e.g., if the sensors 112 are Hall-effect switches), and/or the like. When a filter 204, 206 is attached to the filter mount 202, the prongs 104 and the caps of the filters 204, 206 are within a threshold proximity (e.g., 10 millimeters (mm), 5 mm, or 1 mm), and each of the sensors 112 that align with a respective detectable element 210 may produce a detection state. That is, a sensor 112 may produce the detection state when a detectable element 210 is within the threshold proximity of the sensor 112.

The identification component 100 (e.g., via the sensor system 410) may output, to the controller 420, a single output signal that is based on a detection state (or absence of a detection state) of the sensors 112 (i.e., rather than outputting respective signals from each sensor 112). For example, the identification component 100 may output a first output signal when all of the sensors 112 align with respective detectable elements 210, and may output a second output signal when at least one of the sensors 112 does not align with a respective detectable element 210. In some implementations, the sensor system 410 (e.g., using one or more of the sensors 112 and/or other circuitry) may alter the output signal before the output signal is output to the controller 420. For example, the sensor system 410 may amplify the output signal, modulate the output signal, or convert the output signal to another signal type. As an example, the sensor system 410 may convert the output signal to a pulse width modulation (PWM) signal before the output signal is received by the controller 420.

The output signal may indicate a logical true output or a logical false output, which is identified by the controller 420 as a positive identification or a negative identification, respectively, of the first filter 204 and the second filter 206. A positive identification of the first filter 204 and the second filter 206 may indicate that the first filter 204 and the second filter 206 are attached to the filter mount 202, that the first filter 204 and the second filter 206 are properly installed, that the first filter 204 and the second filter 206 are authorized filters, and/or the like.

The controller 420 may be an electronic control module (ECM) of a machine. The controller 420 may include one or more memories and one or more processors that implement operations associated with filter identification. For example, the controller 420 may be configured to cause an input voltage to be supplied to the identification component 100 (e.g., the sensor system 410 of the identification component 100), receive, from the identification component 100 (e.g., the sensor system 410 of the identification component 100), the single output voltage, and identify a set of filters (e.g., filter 204 and filter 206) based on the single output voltage.

In some implementations, based on a positive or a negative identification of the first filter 204 and the second filter 206, the controller 420 may perform one or more actions. For example, the controller 420 may transmit a notification (e.g., to a user device) or update a display (e.g., of a machine associated with the filter identification module 405) to identify whether the identification was positive or negative, identify one or more features of the first filter 204 and/or the second filter 206, identify a remaining useful life of the first filter 204 and/or the second filter 206, and/or the like. As another example, the controller 420 may enable (e.g., in a case of a positive identification) or disable (e.g., in a case of a negative identification) one or more features or capabilities of a machine associated with the filter identification module 405.

As indicated above, FIG. 4 is provided as an example. Other examples may differ from what is described in connection with FIG. 4.

Figure 5:
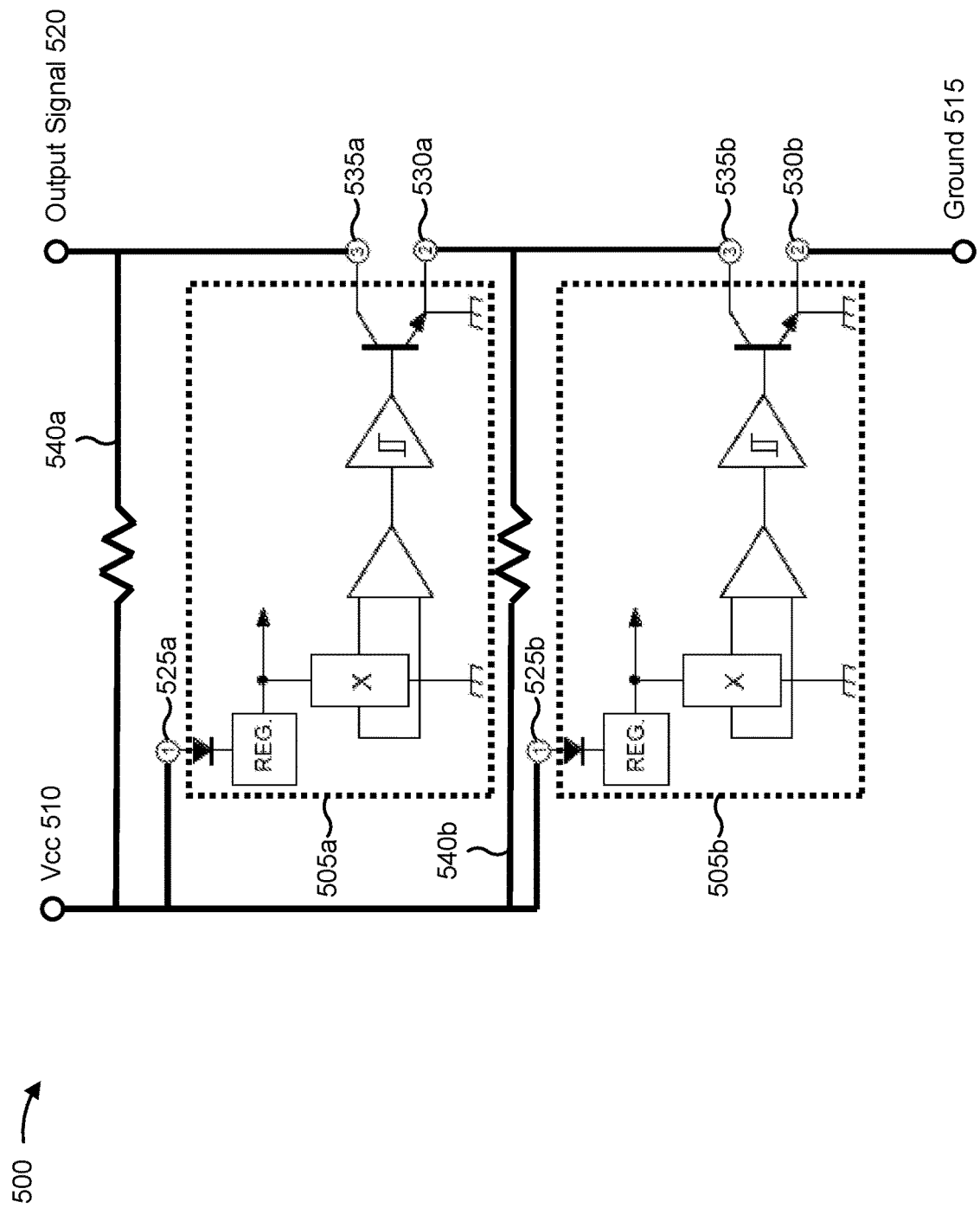
FIG. 5 is a diagram of an example sensor system that may be used with the filter identification system of FIG. 4.

FIG. 5 is a diagram of an example sensor system 500 that may be used with the filter identification system 400 of FIG. 4. For example, the sensor system 500 may correspond to the sensor system 410. As shown in FIG. 5, the sensor system 500 may include a first Hall-effect switch 505a and a second Hall-effect switch 505b. Accordingly, the first Hall-effect switch 505a may be included in the first prong 104a and the second Hall-effect switch 505b may be included in the second prong 104b.

The Hall-effect switches 505 may be included in a circuit that is connected to a supply voltage (Vcc) 510 (e.g., 5 volts (V)) and a ground potential 215 (e.g., 0 V), and that provides an output signal 520. The Hall-effect switches 505 may be three-terminal Hall-effect switches. For example, the Hall-effect switches 505 may have respective input terminals 525a, 525b for receiving a first reference potential (e.g., supply voltage 510), respective ground terminals 530a, 530b for receiving a second reference potential, and respective output terminals 535a, 535b for providing an output signal.

As shown in FIG. 5, the first Hall-effect switch 505a and the second Hall-effect switch 505b may be connected in series. For example, the output terminal 535b of the second Hall-effect switch 505b may be connected to the ground terminal 530a of the first Hall-effect switch 505a. In addition, the ground terminal 530b of the second Hall-effect switch 505b may be connected to the ground potential 515, and the output terminal 535a of the first Hall-effect switch 505a may provide the output signal 520. While FIG. 5 shows two Hall-effect switches connected in this manner, in some implementations, more than two Hall-effect switches may be connected. For example, an output terminal of a successive Hall-effect switch may be connected to a ground terminal of the preceding Hall-effect switch. In such cases, the identification component 100 may include more than two prongs that include respective Hall-effect switches.

The first Hall-effect switch 505a may be configured to provide a first output signal (e.g., voltage) corresponding to a state of the first Hall-effect switch 505a, and the second Hall-effect switch 505b may be configured to provide a second output signal (e.g., voltage) corresponding to a state of the second Hall-effect switch 505b. The state of a Hall-effect switch 505 may indicate whether the Hall-effect switch 505 has detected a magnetic field (e.g., when the Hall-effect switch 505 is within a threshold proximity, that is, a particular distance, of a magnet of a filter, such as filters 204, 206). For example, when a magnetic field is detected, a Hall-effect switch 505 may be in a first state (e.g., a detection state) that causes the Hall-effect switch 505 to output a first voltage that satisfies a first threshold value (e.g., a low voltage below the threshold value, such as 200 millivolts (mV), which is below the supply voltage 510). Alternatively, when a magnetic field is not detected, a Hall-effect switch 505 may be in a second state that causes the Hall-effect switch 505 to output a second voltage that satisfies a second threshold value (e.g., a high voltage above the threshold value, such 5 V, which corresponds to the supply voltage 510) greater than the first threshold value.

In some implementations, the sensor system 500 may include a first resistor 540a that connects the supply voltage 510 and the first output signal off of the output terminal 535a of the first Hall-effect switch 505a, and a second resistor 540b that connects the supply voltage 510 and the second output signal off of the output terminal 535b of the second Hall-effect switch 505b. The resistors 540 may have a resistance that causes the first voltage to be greater than 0 V (and less than the first threshold value), such as 200 mV. This enables differentiation between detection of a magnetic field and another event that may result in a 0 V output, such as a malfunction of the sensor system 500, a loss of power to the sensor system 500, and/or the like.

The first Hall-effect switch 505a may receive the second output signal of the second Hall-effect switch 505b (e.g., because the output terminal 535b is connected to the ground terminal 530a). Accordingly, the first output signal of the first Hall-effect switch 505a may depend upon the second output signal of the second Hall-effect switch 505b. For example, if a magnetic field is not detected by the second Hall-effect switch 505b, then the second Hall-effect switch 505b outputs the second voltage (e.g., the high voltage corresponding to the supply voltage 510). In this way, there is no voltage difference across the first Hall-effect switch 505a from input terminal 525a to ground terminal 530a, which disables the first Hall-effect switch 205a from detecting magnetic fields. As another example, if a magnetic field is detected by the second Hall-effect switch 505b, then the second Hall-effect switch 505b outputs the first voltage (e.g., the low voltage). In this way, there is a voltage difference across the first Hall-effect switch 505a, which enables the first Hall-effect switch 505a to detect magnetic fields.

When the first Hall-effect switch 505a is enabled to detect magnetic fields (e.g., because the second Hall-effect switch 505b detected a magnetic field), the first Hall-effect switch 505a outputs the first voltage (e.g., the low voltage) if the first Hall-effect switch 505a detects a magnetic field, and outputs the second voltage (e.g., the high voltage corresponding to the supply voltage 510) if the first Hall-effect switch 505a does not detect a magnetic field. Otherwise, when the first Hall-effect switch 505a is disabled from detecting magnetic fields (e.g., because the second Hall-effect switch 505b did not detect a magnetic field), the first Hall-effect switch 505a outputs the second voltage (e.g., the high voltage corresponding to the supply voltage 510).

Accordingly, the output signal 520 corresponds to the first output signal of the first Hall-effect switch 505a, which is dependent upon the second output signal of the second Hall-effect switch 505b. In this way, the output signal 520 is a single output signal based on the first output signal of the first Hall-effect switch 505a and the second output signal of the second Hall-effect switch 505b. Moreover, the output signal 520 indicates a combined state of the first Hall-effect switch 505a and the second Hall-effect switch 505b. For example, the combined state indicates whether the first Hall-effect switch 505a and the second Hall-effect switch 505b detected magnetic fields.

The output signal 520 may indicate a logical true output of the sensor system 500 when the output signal 520 is the first voltage (e.g., when the first output signal of the first Hall-effect switch 505a is the first voltage), and the output signal 520 may indicate a logical false output of the sensor system 500 when the output signal 520 is the second voltage (e.g., when the first output signal of the first Hall-effect switch 505a is the second voltage). The output signal 520 is the first voltage (e.g., the low voltage) when the first output signal of the first Hall-effect switch 505a and the second output signal of the second Hall-effect switch 505b are the first voltage, and the output signal 520 is the second voltage (e.g., the high voltage) when at least one of the first output signal of the first Hall-effect switch 505a or the second output signal of the second Hall-effect switch 505b is the second voltage.

As indicated above, FIG. 5 is provided as an example. Other examples may differ from what is described in connection with FIG. 5.

INDUSTRIAL APPLICABILITY

The disclosed filter identification system 400 may be used with any machine having a filter that may be replaced. The filter identification system 400 may employ a sensor system 410 that detects whether filters 204, 206 include detectable elements 210 in an identifiable configuration. For example, the sensor system 410 may include a plurality of Hall-effect switches that are included in distal ends of the prongs 104 of an identification component 100. The prongs 104 may have a length and/or a spacing corresponding to an arrangement of a plurality of magnets 130 in filters 204, 206. Accordingly, when the filters 204, 206 are installed in the machine, a controller 420 of the filter identification system 400 may identify the filters 204, 206 based on a correspondence between the plurality of Hall-effect switches and the plurality of magnets. This enables differentiation between authentic filters and counterfeit filters.

Moreover, the sensor system 410 provides a single logical output (e.g., true or false) indicating whether the filters 204, 206 have been identified. Accordingly, complex sensor/magnet configurations may be used without individual polling of each sensor. Such individual polling in complex configurations requires extra computing resources, increases power usage, and is more susceptible to errors, such as false positives or false negatives. Thus, the sensor system 410 provides filter identification with improved efficiency and accuracy.

As used herein, the articles "a" and "an" are intended to include one or more items, and may be used interchangeably with "one or more." Also, as used herein, the terms "has," "have," "having," or the like are intended to be open-ended terms. Further, the phrase "based on" is intended to mean "based, at least in part, on."

The foregoing disclosure provides illustration and description, but is not intended to be exhaustive or to limit the implementations to the precise form disclosed. Modifications and variations may be made in light of the above disclosure or may be acquired from practice of the implementations. It is intended that the specification be considered as an example only, with a true scope of the disclosure being indicated by the following claims and their equivalents. Even though particular combinations of features are recited in the claims and/or disclosed in the specification, these combinations are not intended to limit the disclosure of various implementations. Although each dependent claim listed below may directly depend on only one claim, the disclosure of various implementations includes each dependent claim in combination with every other claim in the claim set.

What is claimed is:

1. A filter identification system, comprising:
   an identification component disposed in a filter mount configured to hold a set of filters that includes a first filter and a second filter,
   the identification component including a sensor system that includes:
      a first sensor configured to provide a first output signal corresponding to a state of the first sensor; and
      a second sensor configured to provide a second output signal corresponding to a state of the second sensor,
         the sensor system configured to provide a single output signal that is based on the first output signal and the second output signal and indicates a combined state of the first sensor and the second sensor.

2. The filter identification system of claim 1, wherein the identification component has a first prong and a second prong that extend into the filter mount, and
   wherein the first sensor is included in the first prong and the second sensor is included in the second prong.

3. The filter identification system of claim 1, wherein the first filter is a primary fuel filter and the second filter is a secondary fuel filter.

4. The filter identification system of claim 3, wherein the filter mount is configured for a modular low-pressure fuel system.

5. The filter identification system of claim 1, wherein the first sensor is a first radio-frequency identification (RFID) reader and the second sensor is a second RFID reader.

6. The filter identification system of claim 1, wherein the first sensor is a first Hall-effect switch and the second sensor is a second Hall-effect switch.

7. The filter identification system of claim 6, wherein the first Hall-effect switch and the second Hall-effect switch are connected in series.

8. The filter identification system of claim 6, wherein the second output signal is to be received by the first Hall-effect switch such that the first output signal is dependent upon the second output signal, and wherein the single output signal corresponds to the first output signal.

9. The filter identification system of claim 6, wherein the single output signal is to be a first voltage indicating a logical true output when the first Hall-effect switch and the second Hall-effect switch are within a threshold proximity of magnets, or a second voltage indicating a logical false output when at least one of the first Hall-effect switch or the second Hall-effect switch is not within the threshold proximity of a magnet.

10. The filter identification system of claim 9, wherein the single output signal is to be the first voltage when the first output signal and the second output signal are the first voltage, and wherein the single output signal is to be the second voltage when at least one of the first output signal or the second output signal is the second voltage.

11. A filter identification module, comprising:
an identification component that includes a sensor system, the sensor system including:
   a first sensor configured to provide a first output signal corresponding to a state of the first sensor; and
   a second sensor configured to provide a second output signal corresponding to a state of the second sensor,
      the sensor system configured to provide a single output signal that is based on the first output signal and the second output signal and indicates a combined state of the first sensor and the second sensor; and
a controller configured to identify a first filter within a threshold proximity of the first sensor and a second filter within the threshold proximity of the second sensor based on the single output signal.

12. The filter identification module of claim 11, wherein the identification component has a first prong and a second prong that extend from a base and that are configured to extend into a filter mount, and wherein the first sensor is included in the first prong and the second sensor is included in the second prong.

13. The filter identification module of claim 11, wherein the first sensor is a first radio-frequency identification (RFID) reader and the second sensor is a second RFID reader.

14. The filter identification module of claim 11, wherein the first sensor is a first Hall-effect switch and the second sensor is a second Hall-effect switch.

15. The filter identification module of claim 14, wherein the state of the first Hall-effect switch indicates detection of a magnetic field when the first Hall-effect switch is within the threshold proximity of a first magnet of the first filter, and wherein the state of the second Hall-effect switch indicates detection of a magnetic field when the second Hall-effect switch is within the threshold proximity of a second magnet of the second filter.

16. The filter identification module of claim 14, wherein the combined state of the first Hall-effect switch and the second Hall-effect switch indicates whether the first Hall-effect switch and the second Hall-effect switch have detected magnetic fields.

17. The filter identification module of claim 14, wherein the second output signal is to be received by the first Hall-effect switch such that the first output signal is dependent upon the second output signal, and wherein the single output signal corresponds to the first output signal.

18. A method, comprising:
causing an input voltage to be supplied to an identification component that includes a sensor system including a first sensor configured to provide a first output signal corresponding to a state of the first sensor and a second sensor configured to provide a second output signal corresponding to a state of the second sensor,
   the identification component disposed in a filter mount configured to hold a set of filters that includes a first filter and a second filter; and
receiving, from the identification component, a single output voltage that is based on the first output signal and the second output signal and that indicates a combined state of the first sensor and the second sensor.

19. The method of claim 18, further comprising:
identifying the first filter and the second filter, when the first filter is within a threshold proximity of the first sensor and the second filter is within the threshold proximity of the second sensor, based on the single output voltage.

20. The method of claim 18, wherein the first filter includes a first detectable element configured to affect the state of the first sensor and the second filter includes a second detectable element configured to affect the state of the second sensor.

* * * * *